(12) United States Patent
Zhang

(10) Patent No.: US 11,644,499 B2
(45) Date of Patent: May 9, 2023

(54) DEVICE, SYSTEM, AND METHOD FOR TESTING PRINTED CIRCUIT BOARD

(71) Applicants: HKC Corporation Limited, Shenzhen (CN); Chongqing HKC Optoelectronics Technology Co., ltd., Chongqing (CN)

(72) Inventor: Guang Hui Zhang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 186 days.

(21) Appl. No.: 16/087,778

(22) PCT Filed: Mar. 1, 2018

(86) PCT No.: PCT/CN2018/077779
§ 371 (c)(1),
(2) Date: Feb. 25, 2021

(87) PCT Pub. No.: WO2018/157839
PCT Pub. Date: Sep. 7, 2018

(65) Prior Publication Data
US 2021/0349144 A1 Nov. 11, 2021

(30) Foreign Application Priority Data
Mar. 3, 2017 (CN) .......................... 201710123687.1

(51) Int. Cl.
*G01R 31/28* (2006.01)
(52) U.S. Cl.
CPC ..... *G01R 31/2808* (2013.01); *G01R 31/2825* (2013.01)

(58) Field of Classification Search
None
See application file for complete search history.

(56) References Cited

U.S. PATENT DOCUMENTS

| 4,769,596 A * | 9/1988 | Faucett | G01R 31/2805 |
| | | | 324/557 |
| 5,105,896 A * | 4/1992 | Kyrtsos | G01G 19/083 |
| | | | 177/25.14 |
| 2010/0052719 A1* | 3/2010 | Chiu | G01R 1/0416 |
| | | | 324/760.01 |

FOREIGN PATENT DOCUMENTS

| CN | 202189197 U | * | 4/2012 | ............ G02F 1/13 |
| CN | 203037760 U | * | 7/2013 | ............ G01R 31/00 |
| CN | 104165752 A | * | 11/2014 | ........... G01M 11/02 |

* cited by examiner

*Primary Examiner* — Nasima Monsur
(74) *Attorney, Agent, or Firm* — WPAT, P.C

(57) ABSTRACT

A device, a system, and a method for testing a PCB are provided. The PCB includes a first electrical contact and is applied to a display panel. The device includes a test board, a display assembly, a circuit unit, an aligning portion, and a pressing portion. The PCB and the display assembly are positioned on the test board. One end of the circuit unit defines a second electrical contact, and the other end of the circuit unit defines a third electrical contact. The aligning portion is configured to align the first and the second electrical contacts. The third electrical contact is electrically communicated with the display assembly via an electrically conductive adhesive. The pressing portion is configured to press the circuit unit, so that the second electrical contact is electrically connected with the first electrical contact and the display assembly is electrically communicated with the PCB.

18 Claims, 2 Drawing Sheets

DEVICE, SYSTEM, AND METHOD FOR TESTING PRINTED CIRCUIT BOARD

FIELD OF THE DISCLOSURE

The disclosure relates to testing technical field, and more particularly to a device, a system, and a method for testing printed circuit boards.

BACKGROUND

With the continuous development of science and technology, a variety of liquid crystal display products appear one after another. Liquid crystal display (LCD) products are widely used in mobile phones, monitors, LCD TVs and other electronic products. LCD products have pre-delivery inspection. A multimeter is used to test the power signal of the printed circuit board in the LCD products, by judging the power signal voltage or current value is consistent with the standard to determine whether the printed circuit board qualified. In another way, a final test (FT) machine is used to check the printed circuit board, and probes are inserted into the test points of the printed circuit board to test the voltage thereof. Finally the printed circuit board is judged qualified or not according to that the display component connected with the probes is displayed normally or not.

However, the method of using multimeter to test the printed circuit board, is cumbersome, inefficient and cannot measure all the components on the printed circuit board. The method of using the FT machine need to match each type of printed circuit board with a special FT machine, such leads to high test costs.

SUMMARY

The present invention provides a printed circuit board testing device, method and system. The invention is easy to implement, simple structure and low cost.

One embodiment of the present invention provides a device for testing a printed circuit board. The printed circuit board has a first electrical contact and is applied to a display panel. The device includes a test board, a display assembly, a circuit unit, an aligning portion, and a pressing portion. The test board is configured to carry the printed circuit board. The display assembly is positioned on the test board. The circuit unit is arranged on the display assembly. One end of the circuit unit defines a second electrical contact, the other end of the circuit unit defines a third electrical contact, and the third electrical contact is electrically communicated with the display assembly via an electrically conductive adhesive. The aligning portion is provided above the test board, and is configured to align the second electrical contact and the first electrical contact. The pressing portion is positioned above the second electrical contact and is in contact with an upper surface of the circuit unit. The pressing portion is configured to press the second electrical contact, so that the second electrical contact is in contact with the first electrical contact, and the display assembly is electrically communicated with the printed circuit board.

One embodiment of the present invention provides a method for testing a printed circuit board according to the above mentioned device. The method includes steps: placing the printed circuit board on the test board, wherein the first electrical contact is aligned with the second electrical contact; controlling the pressing portion to press the circuit unit until the first electrical contact is in contact with the second electrical contact, so that the printed circuit board is electrically communicated with the display assembly; testing whether the display assembly works normally or not; and judging the printed circuit board qualified or not according to the testing result, wherein the printed circuit board is judged qualified if the display assembly normally works and the printed circuit board is judged unqualified if the display assembly works abnormally.

One embodiment of the present invention provides a system for testing a printed circuit board. The printed circuit board has a first electrical contact and is applied to a display panel. The system includes the above-mentioned device, a pressing unit, a testing unit, and a judging unit.

The above-mentioned device includes a test board, a display assembly, a circuit unit, an aligning portion, and a pressing portion. The test board is configured to carry the printed circuit board. The display assembly is positioned on the test board. The circuit unit is arranged on the display assembly. One end of the circuit unit defines a second electrical contact, the other end of the circuit unit defines a third electrical contact, and the third electrical contact is electrically communicated with the display assembly via an electrically conductive adhesive. The aligning portion is provided above the test board, and is configured to align the second electrical contact and the first electrical contact. The pressing portion is positioned above the second electrical contact and is in contact with an upper surface of the circuit unit. The pressing portion is configured to press the second electrical contact, so that the second electrical contact is in contact with the first electrical contact, and the display assembly is electrically communicated with the printed circuit board.

The pressing unit is configured to control the pressing portion to press the circuit unit.

The testing unit is configured to test whether the display assembly works normally or not, when the display assembly is electrically communicated with the printed circuit board.

The judging unit is configured to judge the printed circuit board qualified or not according to the testing result. The printed circuit board is judged qualified if the display assembly normally works, otherwise, the printed circuit board is judged unqualified.

In the present embodiment, the electrical connection between the printed circuit board and the display assembly is turned on by applying pressure to the circuit unit and so the electrical contact of the printed circuit board is in tight contact with the electrical contact of the circuit unit. In this way, the printed circuit board can be judged qualified or unqualified according to the display assembly displaying normally or not. It is easy to implement, simple structure and low cost.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
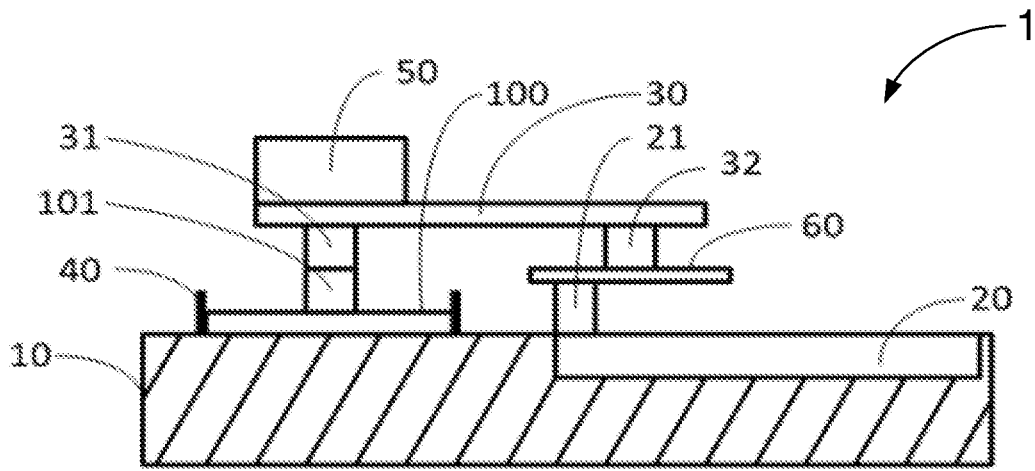
FIG. 1 is a structural schematic view of a device for testing a printed circuit board according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

In the following, structures of device, system, and method associated with the disclosure will be described with reference to FIG. 1 through FIG. 4.

Referring to FIG. 1, a device 1 for testing a printed circuit board 100 includes a test board 10, a display assembly 20, a circuit unit 30, an aligning portion 40, and a pressing portion 50.

The test board 10 is configured to place the printed circuit board 100 and the display assembly 20.

In application, the test board 10 is an operating platform for placing the corresponding component waiting to be tested.

The printed circuit board 100 in this embodiment specifically refers to a printed circuit board applied to a display product. The printed circuit board 100 includes a first electrical contact 101 formed on the main body thereof, and in a particular application, the first electrical contact 100 can be a golden finger.

A display assembly 20 is disposed on the test board 10.

In the present embodiment, the display assembly 20 is embedded in a bottom surface of the test board 10.

In application, the display assembly 20 may be any component which can perform a basic display function, such as a liquid crystal display, a plasma display, a cathode ray tube display, an LED display, etc. The type of display assembly 20 is not particularly limited in this embodiment.

In one embodiment of the present disclosure, the display assembly 20 may refer to a liquid crystal display assembly, which is capable of achieving a basic display function, and includes a backlight, a thin film transistor (TFT) array, and a corresponding liquid crystal pixels array.

In one embodiment of the present disclosure, the display assembly 20 is covered with a color filter.

The circuit unit 30 is arranged on the display assembly 20. One end of the circuit unit 30 defines a second electrical contact 31, the other end of the circuit unit 30 defines a third electrical contact 32. And the third electrical contact 32 is electrically communicated with a lead 21 of the display assembly 20 via an electrically conductive adhesive 60. As such, an electrical connection path is formed from the second electrical contact 31, the circuit unit 30, the third electrical contact 32, the electrically conductive adhesive 60, the lead 21 to the display assembly 20.

In application, the circuit unit 30 may be selected from suitable component having electrically conductive characteristic. In the present embodiment, the circuit unit specifically refers to Chip On Flex or Chip On Film (COF).

In the particular application, the electrically conductive adhesive 60 may be an isotropic conductive adhesive or an anisotropic conductive adhesive. In this embodiment, the electrically conductive adhesive can be an anisotropic conductive adhesive such as an anisotropic conductive film.

The aligning portion 40 is disposed on the test board 10. The aligning portion 40 is configured to define the position of the printed circuit board 100, so that the first electrical contact 101 is provided aligned with the second electrical contact 31.

In application, the aligning portion 40 may be a stop pin or a stop block.

The pressing portion 50 is disposed above the circuit unit 30, and is in contact with an upper surface of the circuit unit 30. The pressing portion 50 is configured to press one end of the circuit unit 30 in which the second electrical contact 31 is defined. So that the second electrical contact 31 is in tight contact with the first electrical contact 101, and the display assembly 20 is electrically communicated with the printed circuit board. That is, an electrical connection path is formed from the printed circuit board 100, the first electrical contact 101, the second electrical contact 31, the circuit unit 30, the third electrical contact 32, the electrically conductive adhesive 60, the lead 21 to the display assembly 20.

In application, the pressing portion 50 can be a press machine, such as a hydraulic press, aerostatic press, screw press, crank press, etc. The driving type of the press machine can be manual or mechanical.

In application, the test board 10 must also be provided with a power supply section for providing power to test the printed circuit board. In this embodiment, the power supply section is not specifically limited, and a corresponding power source may be provided in accordance with the work voltage of the circuit.

The principle of testing the printed circuit board using the device is showed as follows. After the electrical connection path is formed from the printed circuit board to the display assembly, the printed circuit board is energized, and then the display assembly is tested normally working or not, by manual observation or automatic detection with an electronic device. If the display assembly is normally displayed, the printed circuit board is judged qualified, otherwise, the printed circuit board is judged unqualified.

In the present embodiment, the display assembly normally displayed specifically refers to that, images displayed on the screen is normal and stable. In detail, after the electrical connection path is energized between the printed circuit board and the display assembly, the thin film transistors array in the display assembly is turned on, so that the liquid crystal molecules in the liquid crystal pixels array corresponding to the thin film transistor array are deflected to change the polarity of the light emitted from the backlight, finally images are displayed on the screen. If the images displayed on the screen is unstable or flickering, that means the display assembly working abnormally or displaying abnormally.

In the present embodiment, by pressing the circuit unit, the electrical contacts of the printed circuit board and circuit unit are tightly contacted, and the electrical connection path between the printed circuit board and the display assembly is turned on. As such, the printed circuit board can be judged qualified or not, according to whether the display assembly displayed normally or not. The present invention is easy to implement, simple structure and low cost.

In an embodiment of the present disclosure, the device 1 further includes a detecting portion and a controlling portion.

The detecting portion is disposed on the test board 10 and is configured for detecting whether the display assembly normally works or not.

In application, the detecting portion is arranged above and opposite to an emitting surface of the display assembly. The detecting portion can be a luxmeter.

The controlling portion is connected with the detecting portion, and is configured to judge whether the printed circuit board is qualified or not, according to the detecting result of the detecting portion. The printed circuit board is judged qualified if the display assembly normally displays, otherwise, the printed circuit board is judged unqualified.

In application, the controlling portion may be any device having a data analysis and processing and display function, such as a personal computer (PC) terminal, a panel computer, or a particular data processing analysis display device. In application, the controlling portion may be a device implemented based on a microcontroller or integrated circuit.

In this embodiment, it is possible to effectively save manpower and improve the detection efficiency, by automatically detecting the printed circuit board qualified or not and by using the detecting portion instead of manual observation to detect the display situation of display assembly.

In one embodiment of the present disclosure, the controlling portion is also connected to the pressing portion, and is configured to control the pressing portion to apply pressure to the circuit unit. The present embodiment can improve the test efficiency by automatically controlling the pressing portion by using the controlling portion.

Figure 2:
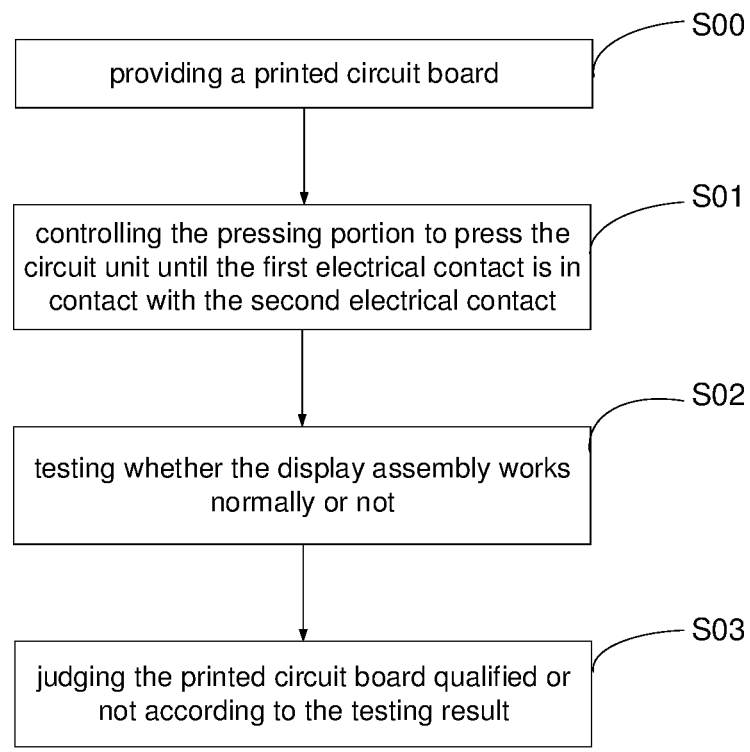
FIG. 2 is a flowchart of a method for testing a printed circuit board according to an embodiment of the disclosure.

Referring to FIG. 1 and FIG. 2, a method for testing the printed circuit board 100, using the device 1, includes the following steps.

Step S00, the printed circuit board 100 is placed on the test board 10 of the device 1. The first electrical contact is aligned with the second electrical contact, and the pressing portion is in contact with an upper surface of the circuit unit.

Step S01, the pressing portion is controlled to press the circuit unit until the first electrical contact is in tight contact with the second electrical contact, so that the printed circuit board is electrically communicated with the display assembly.

In application, the step S01 can be performed manually or mechanically.

Step S02, the display assembly is tested whether it displays normally or not.

In application, step S02 may be performed by an artificial naked eye or by an illuminometer.

Step S03, If the display assembly is normally displayed, the printed circuit board is judged qualified, otherwise, the printed circuit board is judged to be unqualified.

In application, the step S03 may be executed by a device having a data processing analysis and display function such as a personal computer terminal, or may be determined by the person.

Figure 3:
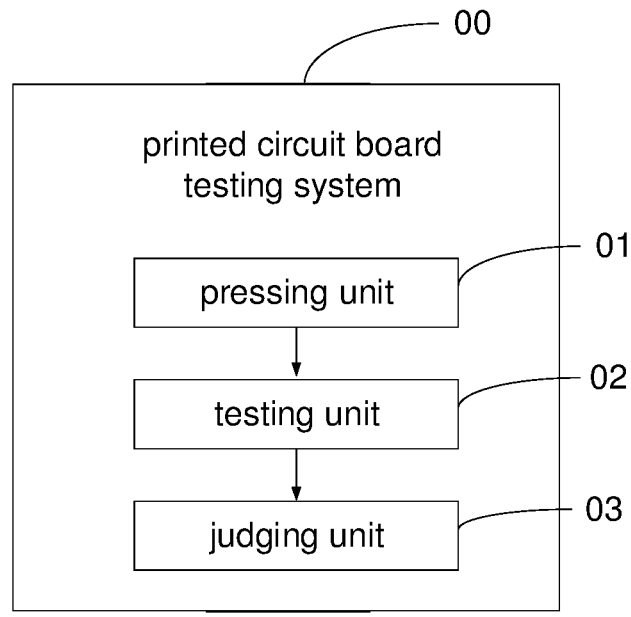
FIG. 3 is a structural schematic view of a system for testing a printed circuit board according to an embodiment of the disclosure.

Referring to FIG. 3, one embodiment of the present disclosure provides a system 00 for testing a printed circuit board, based on the above mentioned device 1. The system is capable of executing the steps shown in FIG. 2. Besides the above mentioned device 1, the system 00 further includes a pressing unit 01, a testing unit 02, and a judging unit 03.

The pressing unit 01 is configured to control the pressing portion to press the circuit unit. So that the second electrical contact is electrically connected with the first electrical contact and the display assembly is electrically communicated with the printed circuit board.

The testing unit 02 is configured to test whether the display assembly normally works or not.

The judging unit 03 is configured to judge the printed circuit board qualified or not, according to the testing result from the testing unit 02. The printed circuit board is judged qualified if the display assembly normally works, otherwise, the printed circuit board is judged unqualified.

In application, the pressing unit 01 may be a servo motor, the testing unit 02 may be a luxmeter, and the judging unit 03 may be a personal computer terminal.

Figure 4:
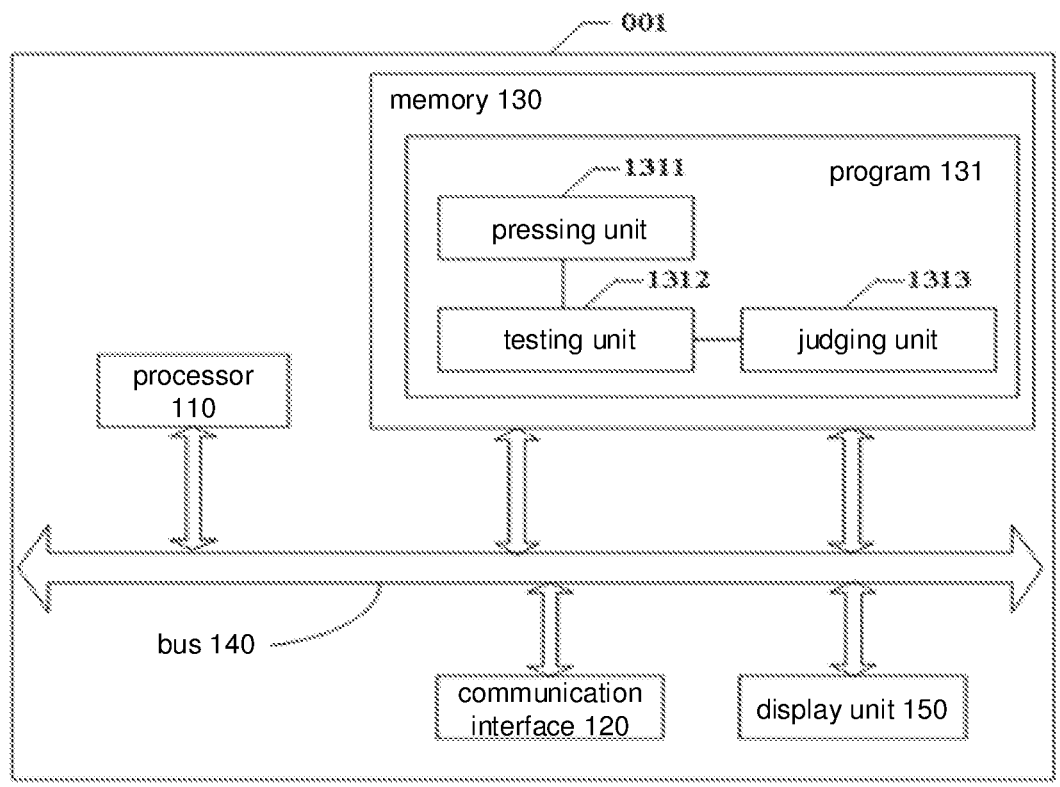
FIG. 4 is a structural schematic view of a system for testing a printed circuit board according to an embodiment of the disclosure.

Referring to FIG. 4, one embodiment of the present disclosure provides a system 001 for testing a printed circuit board. The system 001 includes a processor 110, a communication interface 120, a memory 130, a bus 140, and a display unit 150.

The processor 110, the communication interface 120, the memory 130, and the display unit 150 are communicated by the bus 140.

The communication interface 120 is configured for communicating with external devices, such as personal computers, smart mobile phones, etc. In application, the display unit 150 can be liquid crystal screen or digitron.

The processor 110 is configured to execute a program 131.

In detail, the program 131 includes program codes, and the program codes include computer operation instructions.

Processor 110 may be a central processing unit (CPU), or an application specific integrated circuit, or one or more integrated circuits configured to implement the disclosed embodiments.

The memory 130 is configured to store the program 131. The memory 130 may include high-speed RAM memory, and may also include non-volatile memory, such as at least one disk memory. In detail, the program 131 includes a pressing unit 1311, a testing unit 1312, and a judging unit 1313.

The pressing unit 1311 is configured to control the pressing portion to press the circuit unit. So that the second electrical contact is electrically connected with the first electrical contact and the display assembly is electrically communicated with the printed circuit board. The testing unit 1312 is configured to test whether the display assembly works normally or not. The judging unit 1313 is configured to judge the printed circuit board qualified or not according to the testing result from the testing unit 1312. The printed circuit board is judged qualified if the display assembly normally works, otherwise, the printed circuit board is judged unqualified.

The modules or sub-modules in all embodiments of the present disclosure may be implemented by general integrated circuit, such as CPU or application specific integrated circuit (ASIC).

The steps in the method of the present disclosure may be adjusted sequentially, merged or selectively deleted according to actual needs.

The units in the device of the present disclosure can be combined, divided and selectively deleted according to actual needs.

Persons having ordinary skill in the art understand that, all or part of the steps in the method of the embodiments described above may be accomplished by a computer program. The program may be stored in a computer readable storage medium. In execution, the processes of embodiments of the various methods described above may be included. The storage medium may be a magnetic disk, an optical disk, a read-only memory (ROM), a random access memory (RAM), or the like.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A device for testing a printed circuit board, wherein the printed circuit board includes a first electrical contact and is applied to a display panel, the device comprising:
   a test board configured to carry the printed circuit board;
   a display assembly positioned on the test board, wherein the display assembly and the printed circuit board are located on the test board in a side-by-side manner;
   a circuit unit arranged above and spaced from the display assembly, wherein the circuit unit has an upper surface facing away from the test board and an opposite bottom surface facing toward the test board, one end of the circuit unit defines a second electrical contact at the bottom surface, the other end of the circuit unit defines a third electrical contact at the bottom surface, and the third electrical contact is electrically communicated with the display assembly via an electrically conductive adhesive and whereby the third electrical contact and the electrically conductive adhesive are stacked with each other along a first direction, and the third electrical contact and the electrically conductive adhesive stacked with each other are located between the bottom surface and the display assembly;
   an aligning portion provided on the test board, wherein the aligning portion is configured to align the second electrical contact with the first electrical contact; and
   a pressing portion positioned above the second electrical contact and being in direct contact with the upper surface of the circuit unit, wherein the pressing portion is configured to press the second electrical contact to be in contact with the first electrical contact along the first direction as a pressing direction of the pressing portion and thereby the first electrical contact and the second electrical contact are stacked with each other along the first direction, the first electrical contact and the second electrical contact stacked with each other are located between the bottom surface and the printed circuit board, and the display assembly is electrically communicated with the printed circuit board;
   wherein the aligning portion and the display assembly are located on the test board in a side-by-side manner along a second direction perpendicular to the first direction and both located below the circuit unit.

2. The device according to claim 1, wherein the device further comprises a detecting portion and a controlling portion, the detecting portion is configured to detect whether the display assembly normally works or not, the controlling portion is connected with the detecting portion, and is configured to judge whether the printed circuit board is qualified or not, according to the detecting result of the detecting portion, wherein the printed circuit board is judged qualified if the display assembly normally works and the printed circuit board is judged unqualified if the display assembly works abnormally.

3. The device according to claim 2, wherein the controlling portion is connected with the pressing portion, and the controlling portion is configured to control the pressing portion to apply pressure to the circuit unit.

4. The device according to claim 2, wherein the detecting portion is a luxmeter.

5. The device according to claim 2, wherein the controlling portion is a personal computer.

6. The device according to claim 3, wherein the controlling portion is a personal computer.

7. The device according to claim 1, wherein the aligning portion is a stop pin.

8. The device according to claim 1, wherein the pressing portion is a press machine.

9. The device according to claim 8, wherein the pressing portion is a hydraulic press machine.

10. A method for testing a printed circuit board using the device of claim 1, wherein the printed circuit board is applied to a display panel and includes a first electrical contact, the method comprising:
    placing the printed circuit board on the test board, wherein the first electrical contact is aligned with the second electrical contact;
    controlling the pressing portion to press the circuit unit until the first electrical contact is in tight contact with the second electrical contact, so that the printed circuit board is electrically communicated with the display assembly;
    testing whether the display assembly works normally or not; and judging the printed circuit board qualified or not according to the testing result, wherein the printed circuit board is judged qualified if the display assembly normally works and the printed circuit board is judged unqualified if the display assembly works abnormally.

11. A system for testing a printed circuit board, wherein the printed circuit board includes a first electrical contact and is applied to a display panel, the system comprising:

a test board configured to carry the printed circuit board;

a display assembly positioned on the test board, wherein the display assembly and the printed circuit board are located on the test board in a side-by-side manner;

a circuit unit arranged above and spaced from the display assembly, wherein the circuit unit has an upper surface facing away from the test board and an opposite bottom surface facing toward the test board, one end of the circuit unit defines a second electrical contact at the bottom surface, the other end of the circuit unit defines a third electrical contact at the bottom surface, and the third electrical contact is electrically communicated with the display assembly and whereby the third electrical contact and the electrically conductive adhesive are stacked with each other along a first direction, and the third electrical contact and the electrically conductive adhesive stacked with each other are located between the bottom surface and the display assembly;

an aligning portion provided on the test board, wherein the aligning portion is configured to align the second electrical contact with the first electrical contact;

a pressing portion positioned above the second electrical contact and being in direct contact with the upper surface of the circuit unit, wherein the pressing portion is configured to press the circuit unit to be electrically connected with the first electrical contact along the first direction as a pressing direction of the pressing portion and thereby the first electrical contact and the second electrical contact are stacked with each other along the first direction, the first electrical contact and the second electrical contact stacked with each other are located between the bottom surface and the printed circuit board, and the display assembly is electrically communicated with the printed circuit board; and the aligning portion and the display assembly are located on the test board in a side-by-side manner along a second direction perpendicular to the first direction and both located below the circuit unit;

a servo motor configured to control the pressing portion to press the circuit unit;

a luxmeter configured to test the display assembly works normally or not, when the display assembly is electrically communicated with the printed circuit board; and a personal computer terminal configured to judge the printed circuit board qualified or not according to the testing result, wherein the printed circuit board is judged qualified if the display assembly normally works and the printed circuit board is judged unqualified if the display assembly works abnormally.

12. The system according to claim 11, wherein the third electrical contact is electrically communicated with the display assembly via an electrically conductive adhesive.

13. The system according to claim 12, wherein the display assembly includes a lead, and the electrically conductive adhesive is sandwiched between the lead and the third electrical contact.

14. The system according to claim 13, wherein the first electrical contact, the second electrical contact, and the third electrical contact are golden fingers.

15. The system according to claim 11, wherein the pressing portion is connected with the servo motor, and the personal computer terminal is communicated with the luxmeter.

16. The system according to claim 11, wherein the aligning portion is a stop pin.

17. The system according to claim 11, wherein the pressing portion is a press machine.

18. The system according to claim 16, wherein the pressing portion is a hydraulic press machine.

* * * * *